United States Patent
Xie et al.

(10) Patent No.: US 7,026,184 B2
(45) Date of Patent: Apr. 11, 2006

(54) METHOD OF FABRICATING MICROSTRUCTURES AND DEVICES MADE THEREFROM

(75) Inventors: Huikai Xie, Gainesville, FL (US); Gary K. Fedder, Turtle Creek, PA (US); Zhiyu Pan, Mountain View, CA (US); Wilhelm Frey, Mountain View, CA (US)

(73) Assignee: Carnegie Mellon University, Pittsburgh, PA (US)

( * ) Notice: Subject to any disclaimer, the term of this patent is extended or adjusted under 35 U.S.C. 154(b) by 353 days.

(21) Appl. No.: 10/374,197

(22) Filed: Feb. 26, 2003

(65) Prior Publication Data

US 2004/0166688 A1  Aug. 26, 2004

(51) Int. Cl.
*H01L 21/00* (2006.01)
(52) U.S. Cl. .............. 438/48; 438/52; 438/53; 438/107; 438/108; 438/110
(58) Field of Classification Search ........ 438/706, 438/717–724; 250/330–332, 338.1, 338.2, 250/338.3, 338.4, 340; 365/126–128, 174
See application file for complete search history.

(56) References Cited

U.S. PATENT DOCUMENTS 5,501,893 A   3/1996 Laermer et al.

(Continued)

FOREIGN PATENT DOCUMENTS

WO   WO 02/43148 A2   5/2002

OTHER PUBLICATIONS

Lemkin et al., "A 3-Axis Balanced Accelerometer Using a Single Proof-Mass, " 1997 International Conference on Solid-State Sensors and Actuators, Digest of Technical Papers, Transducers '97, 2: 1185-1188.

(Continued)

*Primary Examiner*—Duy-Vu N. Deo
(74) *Attorney, Agent, or Firm*—Kirkpatrick & Lockhart Nicholson Graham LLP

(57) ABSTRACT

Methods of fabricating micromachined devices are disclosed, as are micromachined (MEMS) devices fabricated using such methods. According to one embodiment, the method includes forming a composite thin film layer stack on a substrate such that composite thin film layer stack comprises a plurality of etch-resistant layers, directionally etching a first portion of the composite thin film layer stack selectively masked by a first etch-resistant layer thereof, and directionally etching a first portion of the substrate selectively masked by the first etch-resistant layer. These steps may result in the formation of a composite thin film microstructure. The method further includes isotropically etching a second portion of the substrate for a controlled period of time to remove substrate material from under the composite thin film microstructure, removing a portion of the first etch-resistant layer and directionally etching a second portion of the composite thin film layer stack selectively masked by a second etch-resistant layer, and directionally etching a third portion of the substrate selectively masked by the second etch-resistant layer to define a second microstructure, the second microstructure comprising a composite thin film layer stack portion and a substrate layer portion. The method may include backside etching the substrate prior to directionally etching the first portion of the composite thin film layer stack and/or removing the composite thin film layer stack portion from the second microstructure after directionally etching the third portion of the substrate. The composite thin film layer stack may include a CMOS circuitry layer stack and the substrate may include single-crystal silicon (SCS).

22 Claims, 5 Drawing Sheets

U.S. PATENT DOCUMENTS

| | | | |
|---|---|---|---|
| 5,707,077 | A | 1/1998 | Koide et al. |
| 5,717,631 | A | 2/1998 | Carley et al. |
| 5,719,073 | A * | 2/1998 | Shaw et al. ............... 438/53 |
| 5,747,353 | A | 5/1998 | Bashir et al. |
| 5,970,315 | A | 10/1999 | Carley et al. |
| 6,088,907 | A * | 7/2000 | Lee et al. ............ 29/603.03 |
| 6,214,633 | B1 * | 4/2001 | Clark et al. ............... 438/48 |
| 6,458,615 | B1 | 10/2002 | Fedder et al. |
| 6,681,063 | B1 * | 1/2004 | Kane et al. ............... 385/18 |
| 6,737,648 | B1 * | 5/2004 | Fedder et al. ............ 250/332 |
| 2004/0195096 | A1 * | 10/2004 | Tsamis et al. ............ 204/426 |

OTHER PUBLICATIONS

Zhang et al., "A Lateral Capacitive CMOS Accelerometer With Structural Curl Compensation," Proc. of the 12th IEEE International Conference on Micro Electro Mechanical Systems (MEMS '99), Jan. 1999, pp. 606-611.

Xie et al., "A CMOS Z-Axis Capacitive Accelerometer With Comb-Finger Sensing," Proc. of the 13th IEEE International Conference on Micro Electro Mechanical Systems (MEMS '00), Jan. 2000, pp. 496-501.

Xie et al., "A CMOS-MEMS Lateral-Axis Gyroscope," Proc. of the 14th IEEE International Conference on Micro Electro Mechanical Systems (MEMS '01), Jan. 2001, pp. 162-165.

Xie et al., "Vertical comb-finger capacitive actuation and sensing for CMOS-MEMS," Sensors and Actuators A 95 (2002) 212-221.

Xie et al., Simulation and Characterization of a CMOS Z-axis Microactuator with Electrostatic Comb Drives, Technical Proceedings of the 2000 International Conference on Modeling and Simulation of Microsystems (MSM 2000), Mar. 2000, pp. 181-184.

Xie, Huikai, "Gyroscope and Micromirror Design Using Vertical-Axis CMOS-MEMS Actuation and Sensing," PhD. Thesis, Carnegie Mellon University. 2002.

Xie et al., "A DRIE CMOS-MEMS Gyroscope," *IEEE Sensors 2002 Conf.*, Jun. 12-14, 2002.

Xie et al., "Post-CMOS Processing for High-Aspect-Ratio Integrated Silicon Microstructures," *Journal on Microelectromechanical Systems*, vol. 11, No. 2, Apr. 2002, pp. 93-101.

Xie et al., "Endoscopic optical coherence tomographic imaging with a CMOS-MEMS micromirror," *Sensor and Actuators A* 103, 2003, pp. 237-241.

* cited by examiner

METHOD OF FABRICATING MICROSTRUCTURES AND DEVICES MADE THEREFROM

STATEMENT REGARDING FEDERALLY SPONSORED RESEARCH AND DEVELOPMENT

The U.S. Government may have certain rights in any patent issued from this application as provided by Grant No. F30602-97-2-0323, awarded by the Defense Advanced Research Projects Agency (DARPA).

BACKGROUND OF THE INVENTION

Microfabrication, also known as micromachining, commonly refers to the use of known semiconductor processing techniques to fabricate devices known as micro-electromechanical systems (MEMS) or micromachined devices, such as micromachined inertial sensors. In general, known MEMS fabrication processes involve the sequential addition and removal of layers of material from a substrate layer through the use of film deposition and etching techniques until the desired structure has been realized.

Single-crystal silicon (SCS) is an often-desired substrate material for MEMS devices because of its excellent mechanical properties and IC-compatibility. For inertial sensors, bulk silicon also provides thick flat structures and large mass, which can lead to high sensitivity and high resolution. In addition, bulk silicon provides the feasibility to make relatively large, flat scanning micromirrors for medical imaging applications. In MEMS devices, bulk silicon may serve as (i) electrodes, (ii) active sensing or actuation elements, as well as (iii) support structures. Therefore, electrical isolation of bulk silicon is required.

It is known in the art to use complementary metal-oxide-semiconductor (CMOS)-compatible fabrication processes to create microstructures (or MEMS structures). Such processes are disclosed in U.S. Pat. No. 5,717,631 to Carley et al., U.S. Pat. No. 5,970,315 to Carley et al., and U.S. Pat. No. 6,458,615 to Fedder et al., each of which is incorporated herein by reference. CMOS-MEMS processing creates microstructures, such as beams, that are made out of the dielectric and metallization layers of CMOS and/or substrate material. One of the CMOS metal layers (or some other layer made from an etch-resistant material) acts as an etch-resistant mask for defining the microstructural sidewalls. A reactive-ion etch of the CMOS oxide layer then creates composite metal/dielectric/substrate material microstructures that can have a high aspect ratio of beam width to beam thickness, and of gaps between adjacent beams to beam thickness. To electrically isolate the substrate material, an isotropic etch of the substrate may then be used to remove the substrate material from under a special composite microstructure (e.g., a short, narrow beam). As a result, the substrate material on both sides of the microstructure is electrically isolated but mechanically connected.

The isotropic etching step, however, has the effect of also removing substrate material from under other structures of the device. The extent of this undercutting depends on the etch time and on the width of the beam being released: the wider the beam the larger the required undercut. This undercutting may not be desirable for other structures of the device, such as interleaved comb fingers, for example, where it is desirable to have as small as undercut as possible. Thus, in many device designs there is conflict between the requirements to undercut in different areas.

SUMMARY OF THE INVENTION

The present invention, in one general aspect, is directed to processes for fabricating a micromachined device. One advantageous feature of the disclosed processes, as described below, is that they permit the fabrication of electrically isolated bare substrate microstructures as well as electrically isolated composite thin film microstructures.

According to one embodiment, the method includes forming a composite thin film layer stack on a substrate such that composite thin film layer stack comprises a plurality of etch-resistant layers. The circuitry layer may include a CMOS circuitry layer stack and the substrate may include single-crystal silicon (SCS), for example. The metal layers of the CMOS circuitry layer stack may serve as the etch-resistant layers for such an embodiment.

The method further includes directionally etching a first portion of the composite thin film layer stack exposed (i.e., selectively masked) by a first etch-resistant layer thereof and then directionally etching a first portion of the substrate exposed by the first etch-resistant layer. These steps may result in the formation of a composite thin film microstructure. For example, where a CMOS circuitry layer stack is used, the composite thin film microstructure may include multiple layers of metal (e.g., Al) and dielectric (e.g., oxide).

The method further includes isotropically etching a second portion of the substrate for a controlled period of time to remove substrate material from under the composite thin film microstructure. The method also includes removing a portion of the first etch-resistant layer and directionally etching a second portion of the composite thin film layer stack exposed (selectively masked) by a second etch-resistant layer. In addition, the method includes directionally etching a third portion of the substrate selectively masked by the second etch-resistant layer to define a second microstructure, the second microstructure comprising a composite thin film layer stack portion and a substrate layer portion.

According to other embodiments, the method may include backside etching the substrate prior to directionally etching the first portion of the composite thin film layer stack and/or removing the composite thin film layer stack portion from the second microstructure after directionally etching the third portion of the substrate.

In another embodiment, the method includes forming a composite thin film layer stack on a substrate such that composite thin film layer stack comprises a plurality of etch-resistant layers. Again, the composite thin film layer stack may include a CMOS circuitry layer stack and the substrate may include SCS. In addition, the method includes backside etching the substrate. The method further includes removing a first portion of the composite thin film layer stack selectively masked by a first etch-resistant layer and then directionally etching a portion of the substrate selectively masked by a second etch-resistant layer. These steps may result in the formation of a microstructure comprising a composite thin film layer stack portion and a substrate layer portion. The method further includes removing the composite thin film layer stack portion from the microstructure.

In another general aspect, the present invention is directed to a micromachined (MEMS) device. According to one embodiment, the MEMS device includes a first microstructure including a first composite thin film microstructure portion and a first underlying substrate portion. The composite thin film microstructure portion may include a CMOS circuitry layer stack portion and the underlying substrate may include SCS. The MEMS device further includes a second microstructure having a bare substrate (e.g., SCS) portion, wherein the bare substrate portion is electrically isolated from the first underlying substrate portion of the first microstructure by an opening. In addition, the MEMS device includes a third microstructure disposed in the opening, the third microstructure having a composite thin film (e.g., CMOS) microstructure portion and no underlying substrate portion.

DESCRIPTION OF THE FIGURES

Embodiments of the present invention are described herein in conjunction with the following figures, wherein.

DETAILED DESCRIPTION OF THE INVENTION

Figure 1:
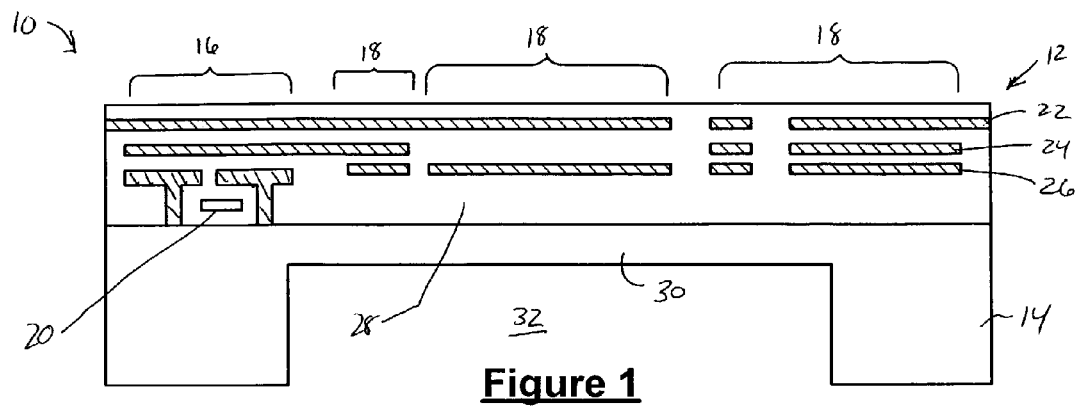
FIGS. 1–9 illustrate various stages in the process of fabricating a micromachined device 10 according to one embodiment of the present invention.

FIGS. 1–9 illustrate various stages in the process of fabricating a micromachined (e.g., MEMS) device 10 according to one embodiment of the present invention. FIG. 1 shows a composite thin film layer stack 12 formed on a substrate 14. The composite thin film layer stack 12 may include a circuitry layer stack such as, for example, a CMOS circuitry layer stack. The CMOS circuitry layer stack may include a CMOS circuitry region 16 and CMOS interconnect regions 18 formed according to conventional CMOS processing techniques. Hereinafter, for purposes of convenience, the composite thin film layer stack 12 is sometimes referred to as a "circuitry layer stack 12" or a "CMOS circuitry layer stack 12." In addition, as stated previously, the circuitry layer stack 12 may include circuitry regions 16 and/or interconnect regions 18.

For an embodiment in which the composite thin film layer stack 12 includes a CMOS circuitry layer stack, the CMOS circuitry layer stack 12 may include polysilicon layers 20 and etch-resistant layers 22, 24, 26. According to one embodiment, the etch-resistant layers 22, 24, 26 may comprise metal such as, for example, aluminum (Al) or copper (Cu). The CMOS circuitry layer stack 12 may also include dielectric layers 28. The dielectric layers 28 may comprise oxide materials such as silicon dioxide, for example.

The substrate 14 may comprise a semiconductor material such as, for example, silicon or a III-V group semiconductor. According to one embodiment, the substrate 14 may comprise single-crystal silicon (SCS). The thickness of the circuitry layer stack 12 may be on the order of 5–7 μm, and the substrate 14 may have a thickness on the order of 400–650 μm. For this reason, the substrate 14 is sometimes referred to herein as a "bulk substrate," or, for an embodiment where the substrate 14 comprises SCS, as "bulk silicon."

FIG. 1 illustrates the MEMS device 10 after an anisotropic backside etch of the substrate 14. A deep trench etch process (e.g., Advanced Silicon Etch (ESA) process for silicon substrate) may be used for this step, leaving a substrate (e.g., SCS) membrane 30 with typically a 10–200 micron thickness. ASE uses alternating passivation/etch cycles to achieve the desired etching depth for the opening 32. Interested readers may refer to U.S. Pat. No. 5,501,893 to Laermer et al., which is incorporated herein by reference, for more details regarding anisotropic etching of silicon.

According to other embodiments, the backside etching step may be performed later in the processing sequence.

Figure 2:
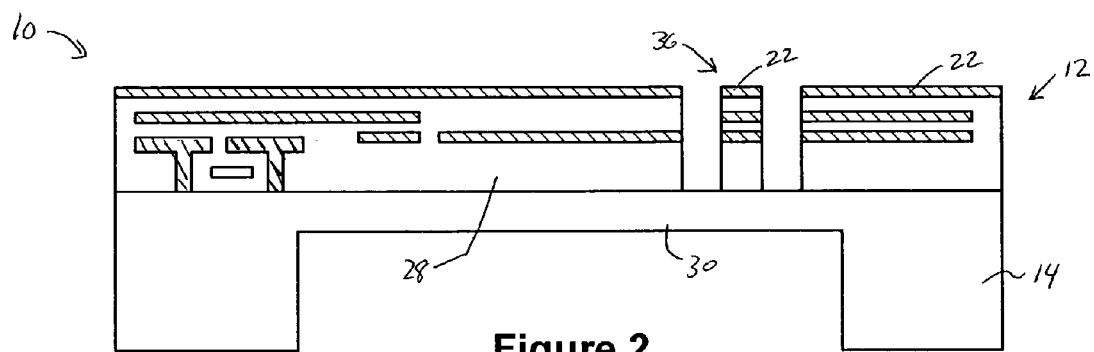

FIG. 2 illustrates the device 10 after anisotropically etching portions of the dielectric layers 28 of the circuitry layer stack 12. A frontside reactive ion etch (RIE) may be used for this step, utilizing the upper etch-resistant layer 22 of the circuitry layer stack 12 as the etch mask such that only those portions of the dielectric layers 28 exposed (i.e., selectively masked) by the upper etch-resistant layer 22 are removed. The term "upper etch-resistant layer," and more generally the term "etch resistant layer" are used herein to refer to the upper-most etch-resistant layer of the circuitry layer stack 12, regardless of whether each portion of the upper etch-resistant layer occupies the same layer of the circuitry layer stack 12. The anisotropic etching step of FIG. 2 may result in a composite, (e.g., CMOS metal/dielectric) thin film microstructure 36. Details regarding a suitable RIE process are disclosed in U.S. Pat. No. 5,727,631 to Carley et al. and U.S. Pat. No. 6,458,615 to Fedder et al., referenced previously.

Figure 3:
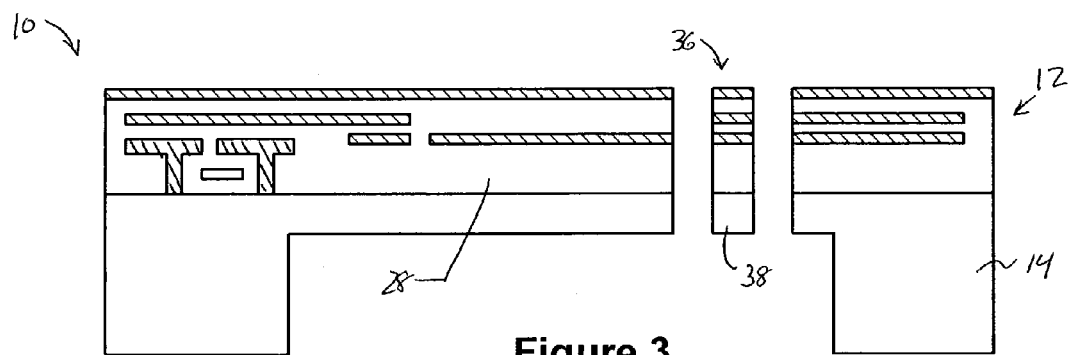

FIG. 3 illustrates the device 10 after an anisotropic etch is used to etch through a portion of the substrate membrane 30. A deep reactive ion etch (DRIE), such as described in U.S. Pat. No. 6,458,615, may be used to directionally etch the membrane 30. By utilizing a DRIE, sufficiently high aspect ratio structures, such as the composite thin film microstructure 36, with well-defined sidewalls can be achieved.

Figure 4:
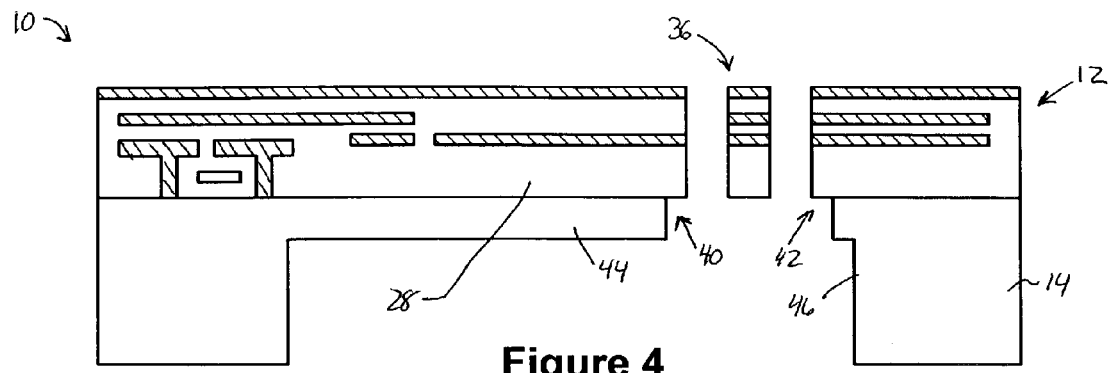

FIG. 4 illustrates the device 10 after an isotropic etch of a portion of the substrate 14. Details regarding a suitable isotropic etching process are provided in U.S. Pat. No. 6,458,615. Because an isotropic etch is used to remove the substrate material 38 (see FIG. 3) from under the microstructure 36, substrate material is also removed from under other regions 40, 42 of the circuitry layer stack 12. In order to minimize the amount of undercutting, the isotropic etch may last for a controlled period of time that is only so long as to remove the substrate material 38 from under the composite thin film microstructure 36. This isotropic etching step may result in electrical isolation of the substrate portions 44, 46 on each side of the microstructure 36. As described further hereinafter, the substrate portion 46 may serve as an anchor portion of the MEMS device 10.

Figure 5:
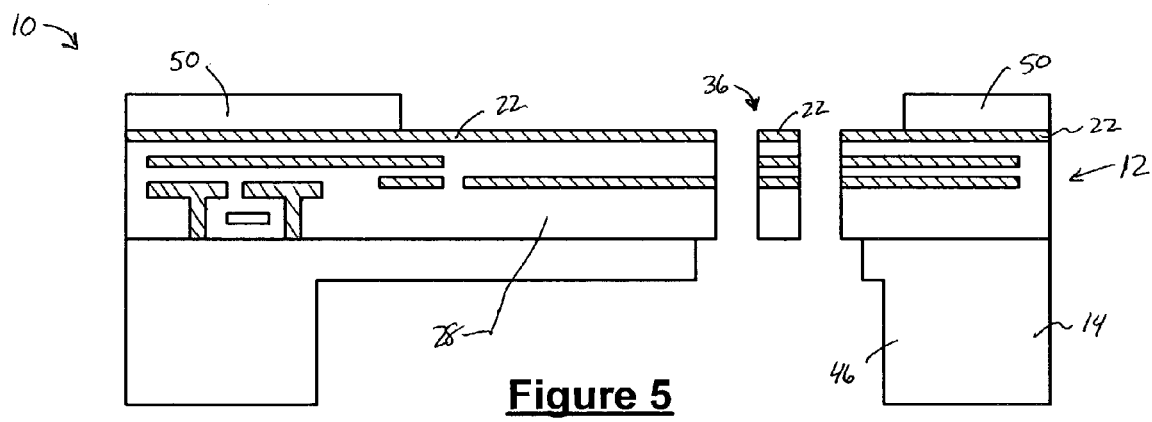
Figure 6:
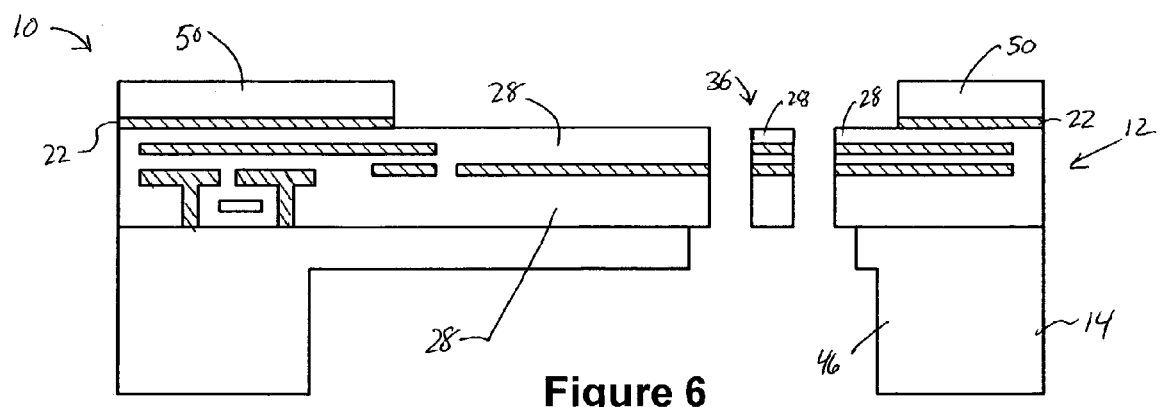

According to one embodiment, the process may next comprise removal of portions of the upper etch-resistant layer 22. A process for removing portions of the upper etch-resistant layer 22 is illustrated in FIGS. 5 and 6. FIG. 5 shows the device 10 after deposition of a pattern layer 50 on selected portions of the circuitry layer stack 12. The pattern layer 50, which may comprise, for example, photoresist, may be selectively patterned on the circuitry layer stack 12 to protect circuits and bond pads of the circuitry layer stack 12. FIG. 6 illustrates the device 10 after removal of portions of the upper etch-resistant layer 22 selectively masked by the pattern layer 50. According to one embodiment, ion milling of the upper etch-resistant layer 22 may be used to remove the selected portions thereof. The resulting structures (including microstructure 36) may still be covered by a dielectric layer 28 (e.g., oxide). According to another embodiment, the selected portions of the upper etch-resistant layer 22 may be removed using a shadow mask (not shown), as is known in the art, rather than by using a photoresist pattern layer 50. Regarding application of the pattern layer 50, spinning photoresist on a device with openings etched through to the backside may be difficult. Thus, according to alternative embodiments, a dry-film photoresist can be laminated on top circuitry layer stack 12 to act as the pattern mask, one of the etch-resistant layers of the circuitry layer stack 12 may be used as a mask layer, or the backside etch step may be performed at the end of the processing.

Figure 7:
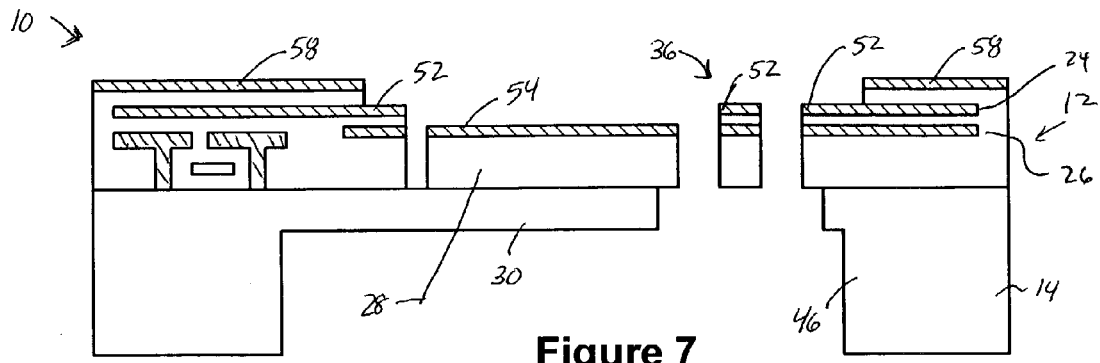

FIG. 7 illustrates the device 10 after removal of the pattern layer 50 and a second anisotropic etching of selected portions of the dielectric layers 28 of the circuitry layer stack 12. The anisotropic dielectric etching step of FIG. 7 may be similar to that of FIG. 2, except that portions 52 of the second metal layer 24 and 54 of the first metal layer 26, as well the remaining portions 58 of the upper metal layer 22 may now act as the etch mask (i.e., "collectively the uppermost etch-resistant layer").

Figure 8:
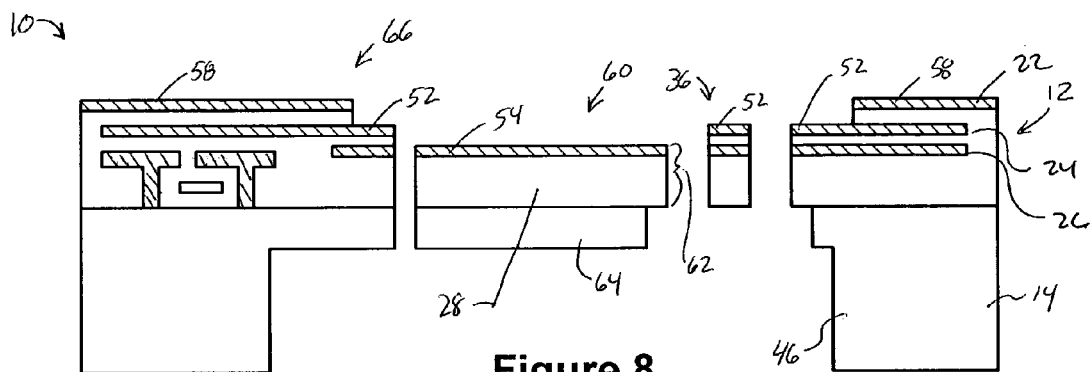

FIG. 8 illustrates the device 10 after a directional (i.e., anisotropic) etch of another portion of the substrate membrane 30 (see FIG. 7). The directional etch of the substrate membrane of FIG. 8 may be similar to that of FIG. 3 (e.g., a DRIE). The directional etching may yield a second microstructure 60 having an upper composite thin film layer stack portion 62 and a lower substrate layer portion 64. Note that in contrast to the isotropic substrate etching shown in FIG. 4, the etching of FIG. 8 is anisotropic such that substrate material under the second microstructure 60 and the adjacent structure 66 are not undercut. In some designs the structure 66 may also serve as an anchor for the MEMS device 10.

Figure 9:
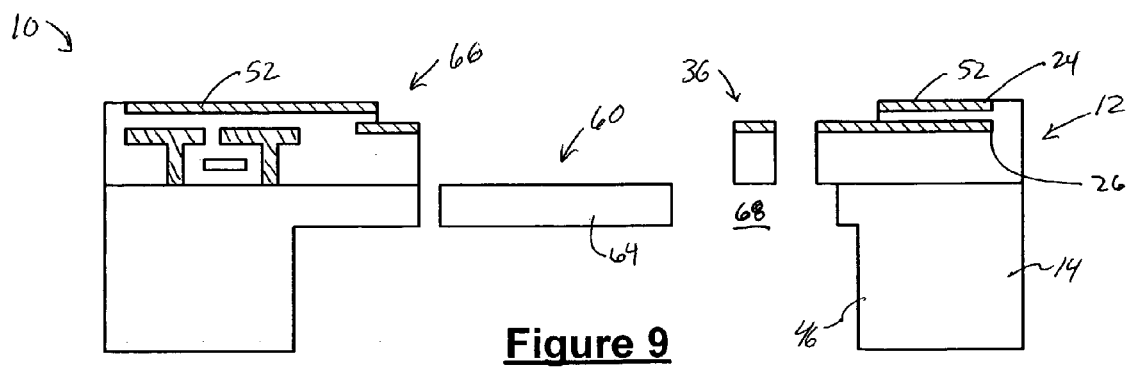

According to one embodiment of the present invention, the process may further include removing the composite thin film layer stack portion 62 from the second microstructure 60, as shown in FIG. 9. All the exposed metal regions (i.e., 52 and 54) may be removed by ion milling, followed by an anisotropic dielectric etching step similar to that of FIG. 2. This removal step may be performed, for example, by using a portion of one of the etch-resistant layers 52 as the mask layer. According to another embodiment, the process may include using photoresist as a mask layer, as described previously in conjunction with FIGS. 5 and 6. That is, the step may comprise using a pattern layer (or a shadow mask) of photoresist (or dry-film photoresist laminated on the top of the structure) to define the removal areas for the etch-resistant layers, which may be removed by ion milling, as described previously.

As can be seen by comparing FIGS. 8 and 9, portions of regions 52 of the second etch-resistant layer 24 were removed, as were portions of regions 54 of the third etch-resistant layer 26. Further, as shown in FIG. 9, an anisotropic etch of the selectively masked dielectric layers 28 may be performed to remove the remainder of the composite thin film layer stack portion 62. The anisotropic etch may be similar to that described previously in conjunction with FIG. 2. The processing steps shown in FIG. 9 may result, for example, in the removal of the upper metal and dielectric layers of the composite thin film microstructure 36, and in the removal of the composite thin film layer stack portion 62 of the second microstructure 60, resulting in a bare substrate (e.g., SCS) structure 64.

As mentioned previously, the substrate portion 46, along with the circuitry layer stack portion 42 (see FIG. 4) thereon, may serve as an anchor portion for the MEMS device 10. The substrate portion 46 is separated from the bare substrate microstructure 64 by an opening 68 such that the composite thin film microstructure 36 is disposed in the opening 68.

The process sequence described above permits the formation of electrically isolated bare substrate (e.g., SCS) structures, such as microstructure 60 in FIG. 9. In some applications, however, only electrical isolation or only bare substrate structures may be desired. In either of these two cases, the process may be appropriately modified according to other embodiments of the present invention. For example, to provide electrical isolation only, the steps of removing selected portions of the metal and oxide layers shown in FIG. 9 may be eliminated. For the case where no electrical isolation is required, the processing steps illustrated in FIGS. 2–4 may be eliminated.

Thus, various embodiments of the above-described processes permit independent control of the DRIE of portions of the substrate material (e.g., FIGS. 3 and 8) for isolating structures and defining regular structures. Consequently, for example, the gap between substrate structures (e.g., microstructures 60, 66) can be minimized. Further, the process provides the ability to form microstructures with electrical isolation (e.g., microstructure 36) and bare substrate structures (e.g., microstructure 60) simultaneously or either feature individually. In addition, for an embodiment where the substrate 14 comprises SCS, the process exploits the excellent material properties of SCS, such as stable SCS springs, zero residual stress gradients resulting in zero out-of-substrate-plane curling, large SCS microstructural mass, and repeatable temperature performance characteristics over time. Also, embodiments of the above-described process are completely compatible with commercial CMOS fabrication processes. Consequently, CMOS circuitry may be integrated with microstructures on the same chip device.

Other advantageous features of the above-described process include the ability to obtain thick bulk substrate structures, up to the thickness of the wafer, and high wiring design flexibility. Among other things, this makes the processes of the present invention very suitable for making inertial sensors.

Figure 10:
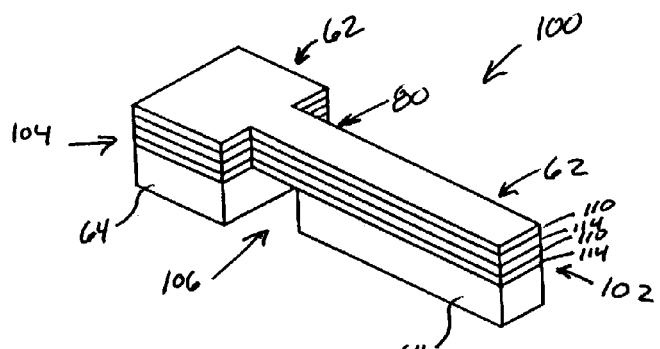
FIGS. 10–15 illustrate various micromachined (MEMS) devices, or portions thereof, according to various embodiments of the present invention.
Figure 11:
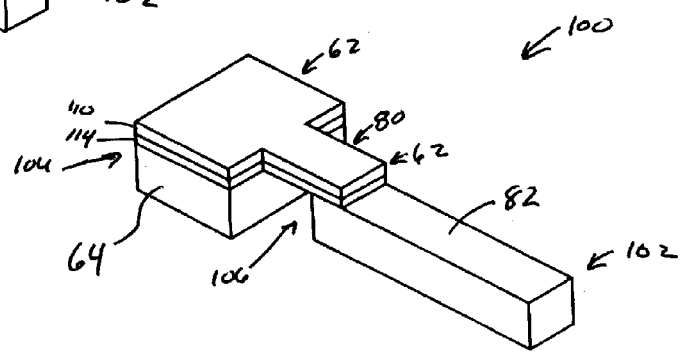

The methods of the present invention may be used to create, for example, micromachined (i.e., MEMS) devices having completely undercut composite thin film microstructures and bare substrate (e.g., SCS) microstructures. For example, the methods of the present invention may be used to create individually wirable comb fingers. Comb fingers are common components of MEMS devices, such as for parallel plate capacitive sensors. FIGS. 10 and 11 illustrate portions of a MEMS device 100 including an individually wirable comb finger 102. The comb finger 102 is separated from an anchor portion 104 of the MEMS device 100 by an opening 106. The comb finger 102 includes a substrate (e.g., SCS) portion 64 and a composite thin film (e.g., CMOS circuitry) layer 62. The anchor portion 104 also includes a substrate portion 64 and a composite thin film layer stack 62. In addition, a composite thin film microstructure 80 may span the opening 106, thereby interconnecting the comb finger 102 and the anchor portion 104. The microstructure 80 spanning the opening 106 may be formed as described previously (see FIGS. 1–4).

The MEMS device 100 of FIG. 10 provides electrical isolation between the substrate portions 64 of the comb finger 102 and anchor portion 104. In the illustrated embodiment of FIG. 10, the composite thin film layer stack portions 62 include two metal (e.g., Al) layers 110 and two dielectric (e.g., oxide) layers 114. In FIG. 11, a portion of the composite thin film layer stack 62 is removed from the substrate portion 64, thereby creating a bare substrate portion 82. This may be achieved, for example, pursuant to the processing steps described previously in conjunction with FIGS. 5–9. As such, the MEMS device 100 of FIG. 11 includes an electrically isolated, bare substrate portion 82.

As described in published PCT application WO 02/43148 A2, entitled "Micromachined Infrared Sensitive Pixel And Infrared Imager Including Same," by Fedder et al., which is hereby incorporated by reference, composite thin film microstructures including metal layers and dielectric layers, such as microstructure 36 of FIG. 9, may bend due to a temperature change because of the different temperature coefficients of expansion (TCE) of the metal and dielectric layers of the composite thin film microstructure. For example, for a composite CMOS microstructure including Al metal layers and an oxide inter-layer dielectric, the aluminum has a TCE of approximately $23 \times 10^{-6}$ K$^{-1}$ and the oxide has a TCE of approximately $0.4 \times 10^{-6}$ K$^{-1}$.

Figure 12:
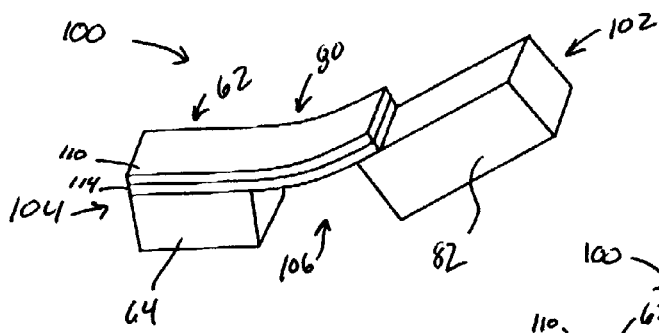
Figure 13:
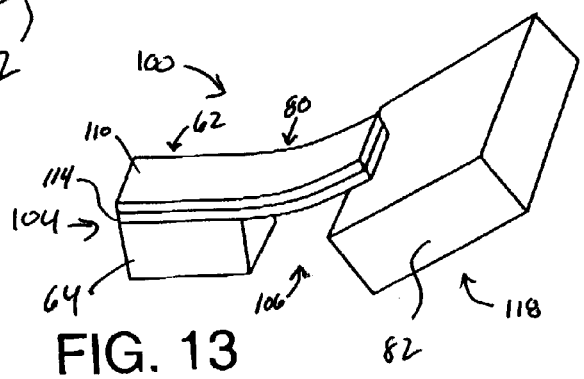

FIGS. 12 and 13 show portions of a MEMS device 100 exploiting this bending (or curling) property of the composite thin film layer stack portion 62. In FIG. 12, the MEMS device 100 includes the anchor portion 104 and a comb finger 102. In FIG. 13, the MEMS device includes the anchor portion 104 and a plate portion 118. As can be seen in both FIGS. 12 and 13, the MEMS devices 100 may include isolated bare substrate (e.g., SCS) microstructures 82. Such microstructures (80, 82) may be fabricated according to the processes described previously in conjunction with FIGS. 1–9.

Figure 14:
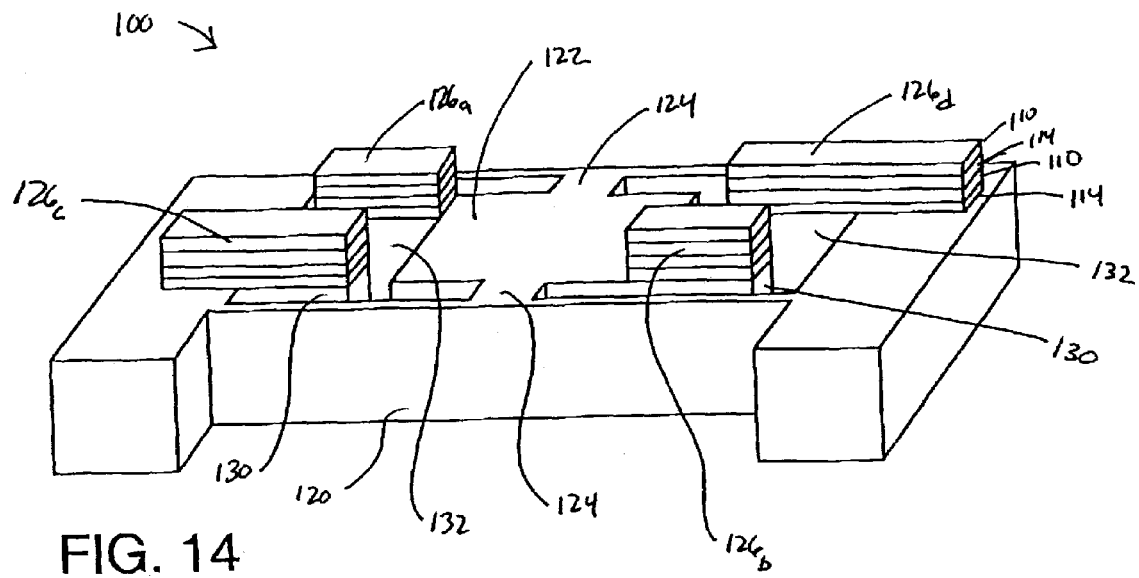

FIG. 14 is a diagram of a MEMS device 100 according to another embodiment of the present invention. The MEMS device 100 of FIG. 14 includes a support frame 120 and a central proof mass member 122 interconnected by support beams 124. The underlying layers of the support frame 120, central proof mass member 122 and support beams 124 may be comprised of the substrate material (e.g., SCS). In addition, the MEMS device 100 of FIG. 14 includes composite thin film (e.g., CMOS) microstructures 126a–d. The microstructures 126a–d may comprise alternating metal (e.g., Al) layers 110 and dielectric (e.g., oxide) layers 114.

A number of the composite thin film microstructures 126a,b may be fabricated on spring portions 130 of the central proof mass member 122 and a number of the composite thin film members 126c,d may be fabricated on spring portions 132 of the support frame 120. The microstructures 126a and 126c, for example, may form a parallel plate capacitor, as may the microstructure 126b,d. Relative movement of the microstructures 126a,c and 126b,d can be detected by sensing the capacitance between the microstructures. The underlying substrate portions of the spring portions 130, 132 supporting the microstructures 126a–d need not be undercut using the processes of the present invention, thereby maintaining the structural integrity of the device 100.

A device 100 such as illustrated in FIG. 14 solves the problem of how to wire (i.e., electrically interconnect) the composite thin film microstructures 126. Presently, diffusion wiring techniques are commonly used. This technique, however, suffers from then inevitable introduction of parasitic capacitances that may deleteriously affect the sensitivity of the device. In contrast, with the device 100 of FIG. 14, circuitry (not shown), such as CMOS circuitry, may be fabricated on the central proof mass member 122 or the support frame 120 in close proximity to the microstructures 126. Such a design lessens the amount of parasitic capacitance introduced due to wiring the microstructures 126.

Figure 15:
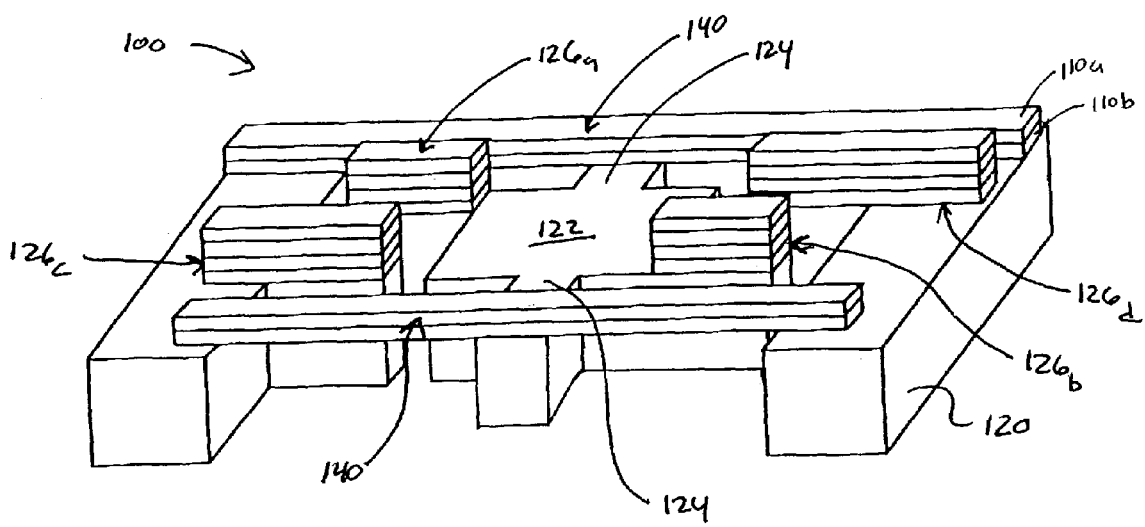

FIG. 15 is a diagram of a MEMS device 100 according to another embodiment of the present invention. The device 100 of FIG. 15 is similar to that of FIG. 14 except that the device 100 of FIG. 15 includes z-compliant springs 140 for sensing/actuation in the z-direction. Such a design may be used for tri-axis (x, y, and z axes) sensing/actuation devices. Interested readers may refer to Xie, H., "Gyroscope and Micromirror Design Using Vertical-Axis CMOS-MEMS Actuation and Sensing," PhD. thesis, Carnegie Mellon University, 2002, which is incorporated herein by reference, for more details regarding tri-axis sensors. The z-compliant springs 140 may comprise composite thin film microstructures (e.g., CMOS) that may deflect in the z-axis, such as described previously in connection with FIGS. 12 and 13. The z-compliant springs 140 may include a metal (e.g. Al) layer 110a and a dielectric (e.g., oxide) layer 110b, and may be formed pursuant to the fabrication processes described previously herein.

The above-described MEMS devices 100 are just an example of the devices that can be fabricated using the processes of the present invention. For example, more complex MEMS devices, such as vibratory gyroscopes, high-performance inertial sensors and optical scanning devices may also be fabricated using the process of the present invention.

Although the present invention has been described herein with respect to certain embodiments, those of ordinary skill in the art will recognize that many modifications and variations of the present invention may be implemented. For example, the materials and process parameters disclosed are illustrative, but are not exhaustive. Other materials and process parameters may also be used. In addition, the described processing sequences may be varied. For example, the backside etching step may be performed at various stages of the processing sequence. The foregoing description and the following claims are intended to cover all such modifications and variations.

What is claimed is:

1. A method of fabricating a micromachined device, comprising:
    forming a composite thin film layer stack on a substrate, the composite thin film layer stack having a plurality of etch-resistant layers;
    directionally etching a first portion of the composite thin film layer stack selectively masked by a first etch-resistant layer;
    directionally etching a first portion of the substrate selectively masked by the first etch-resistant layer to define a first composite thin film microstructure;
    isotropically etching a second portion of the substrate for a controlled period of time to remove substrate material from under the first composite thin film microstructure;
    removing a portion of the first etch-resistant layer;
    directionally etching a second portion of the composite thin film layer stack selectively masked by a second etch-resistant layer; and
    directionally etching a third portion of the substrate selectively masked by the second etch-resistant layer to define a second microstructure, the second microstructure comprising a composite thin film layer stack portion and a substrate layer portion.

2. The method of claim 1, wherein the composite thin film layer stacks includes a circuitry layer stack.

3. The method of claim 2, wherein the circuitry layer stack includes a CMOS circuitry layer stack.

4. The method of claim 1, wherein forming the composite thin film layer stack includes forming a CMOS circuitry layer stack on SCS substrate.

5. The method of claim 4, wherein the first composite thin film microstructure includes at least one metal layer and at least one dielectric layer.

6. The method of claim 1, wherein each of the plurality of etch-resistant layers of the composite thin film layer stack includes metal.

7. The method of claim 1, wherein removing the portion of the first etch-resistant layer includes ion milling the portion of the first etch-resistant layer.

8. The method of claim 7, wherein directionally etching the first portion of the composite thin film layer stack includes directionally etching a first dielectric portion of the composite thin film layer stack.

9. The method of claim 8, wherein directionally etching the second portion of the composite thin film layer stack includes directionally etching a second dielectric portion of the composite thin film layer stack.

10. The method of claim 9, further comprising removing the composite thin film layer stack portion from the second microstructure after directionally etching the third portion of the substrate.

11. The method of claim 10, wherein removing the composite thin film layer stack portion from the second microstructure includes:
    removing a portion of the second etch-resistant layer; and
    directionally etching a third portion of the composite thin film layer stack.

12. The method of claim 11, wherein removing a portion of the second etch-resistant layer includes ion milling the second etch-resistant layer.

13. The method of claim 1, further comprising removing the composite thin film layer stack portion from the second microstructure after directionally etching the third portion of the substrate.

14. The method of claim 1, further comprising backside etching the substrate.

15. A method of fabricating a micromachined device, comprising:
    forming a CMOS circuitry layer stack on a SCS substrate, the CMOS circuitry layer stack having a plurality of metal etch-resistant layers;
    directionally etching a first portion of the CMOS circuitry layer stack selectively masked by a first metal etch-resistant layer;
    directionally etching a first portion of the SCS substrate selectively masked by the first metal etch-resistant layer;
    isotropically etching a second portion of the SCS substrate for a controlled period of time to remove substrate material from under a first composite CMOS thin film microstructure;
    removing a portion of the first metal etch-resistant layer;
    directionally etching a second portion of the CMOS circuitry layer stack selectively masked by a second metal etch-resistant layer; and
    directionally etching a third portion of the SCS substrate selectively masked by the second metal etch-resistant layer to define a second microstructure, the second microstructure comprising a composite CMOS thin film layer stack portion and a SCS substrate layer portion.

16. The method of claim 15, further comprising backside etching the SCS substrate.

17. The method of claim 16, further comprising removing the composite CMOS thin film layer stack portion from the second microstructure after directionally etching the third portion of the SCS substrate.

18. The method of claim 16, wherein removing the composite CMOS thin film layer stack portion from the second microstructure includes:
    removing a portion of the second etch-resistant layer; and
    directionally etching a third portion of the composite thin film layer stack.

19. The method of claim 15, wherein the first composite CMOS thin film microstructure includes at least one metal layer and at least one dielectric layer.

20. A method of fabricating a micromachined device, comprising:
    forming a composite thin film layer stack on a substrate, the circuitry layer including a plurality of etch-resistant layers;
    backside etching the substrate;
    removing a first portion of the composite thin film layer stack selectively masked by a first etch-resistant layer;
    directionally etching a portion of the substrate selectively masked by a second etch-resistant layer to define a microstructure, the microstructure comprising a composite thin film layer stack portion and a substrate layer portion; and
    removing the composite thin film layer stack portion from the microstructure by:
        removing a portion of a second etch-resistant layer; and
        directionally etching a second portion of the composite thin film layer stack.

21. The method of claim 20, wherein forming the composite thin film layer stack includes forming a CMOS circuitry layer stack on a SCS substrate.

22. The method of claim 20, wherein removing the first portion of the composite thin film layer stack includes directionally etching the first portion of the composite thin film layer stack.

* * * * *